US009852893B2

United States Patent
Chen et al.

(10) Patent No.: US 9,852,893 B2
(45) Date of Patent: Dec. 26, 2017

(54) DIPOLE RING MAGNET ASSISTED MICROWAVE RADIAL LINE SLOT ANTENNA PLASMA PROCESSING METHOD AND APPARATUS

(71) Applicants: Tokyo Electron Limited, Tokyo (JP); University of Houston System, Houston, TX (US)

(72) Inventors: Lee Chen, Cedar Creek, TX (US); Demetre J. Economou, Houston, TX (US); Jianping Zhao, Austin, TX (US); Merritt Funk, Austin, TX (US)

(73) Assignees: Tokyo Electron Limited, Tokyo (JP); University of Houston System, Houston, TX (US)

( * ) Notice: Subject to any disclaimer, the term of this patent is extended or adjusted under 35 U.S.C. 154(b) by 0 days.

(21) Appl. No.: 15/088,834

(22) Filed: Apr. 1, 2016

(65) Prior Publication Data
US 2016/0293389 A1    Oct. 6, 2016

Related U.S. Application Data

(60) Provisional application No. 62/142,868, filed on Apr. 3, 2015.

(51) Int. Cl.
*H01J 37/32* (2006.01)
(52) U.S. Cl.
CPC .... *H01J 37/32669* (2013.01); *H01J 37/3222* (2013.01); *H01J 37/32293* (2013.01); *H01J 2237/152* (2013.01)

(58) Field of Classification Search
CPC ............ H01J 37/32669; H01J 37/3222; H01J 37/32293
See application file for complete search history.

(56) References Cited

U.S. PATENT DOCUMENTS

| 5,595,627 A | 1/1997 | Inazawa et al. | |
| 5,660,744 A * | 8/1997 | Sekine | H01J 37/32623 204/298.16 |
| 2005/0099133 A1 * | 5/2005 | Quon | H01J 37/321 315/111.01 |
| 2013/0052833 A1 * | 2/2013 | Ranjan | H01L 21/31116 438/714 |

* cited by examiner

*Primary Examiner* — Duy Vu N Deo
(74) *Attorney, Agent, or Firm* — Wood Herron & Evans LLP

(57) ABSTRACT

A method and apparatus is provided for obtaining a low average electron energy flux onto a substrate in a processing chamber. A processing chamber includes a substrate support therein for chemical processing. An energy source induced plasma, and ion propelling means, directs energetic plasma electrons toward the substrate support. A dipole ring magnet field is applied perpendicular to the direction of ion travel, to effectively prevent electrons above an acceptable maximum energy level from reaching the substrate holder. Rotation of the dipole magnetic field reduces electron non-uniformities.

6 Claims, 1 Drawing Sheet

DIPOLE RING MAGNET ASSISTED MICROWAVE RADIAL LINE SLOT ANTENNA PLASMA PROCESSING METHOD AND APPARATUS

CROSS REFERENCE TO RELATED APPLICATION

Pursuant to 37 C.F.R. §1.78(a)(4), the present application claims the benefit of and priority to co-pending Provisional Application No. 62/142,868 filed on Apr. 3, 2015, and entitled DIPOLE RING MAGNET ASSISTED MICROWAVE RADIAL LINE SLOT ANTENNA PLASMA PROCESSING METHOD AND APPARATUS, which is expressly incorporated herein by reference.

FIELD OF THE INVENTION

The invention relates to plasma processing with microwave (MW) plasmas, particularly surface wave plasmas (SWP), for example as produced with a Radial Line Slot Antenna, and more particularly, to a method and apparatus providing relatively low electron energies and plasma uniformity near a treated substrate.

BACKGROUND OF THE INVENTION

Typically, during semiconductor processing, a plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a processing chamber and etching exposed areas of the substrate through the pattern.

Once the substrate is positioned within the chamber, it is etched by introducing an ionizable, dissociative gas mixture into the chamber at a pre-specified flow rate, while adjusting a vacuum pump to achieve a processing pressure. Then, plasma is formed when a portion of the gas species is ionized by collisions with energetic electrons. The gas may be ionized by direct current, radio frequency, microwave energy, or other energy sources known to the art. The energetic electrons dissociate some of the gas species in the gas mixture to create reactant species suitable for the exposed-surface etch chemistry. Once the plasma is formed, exposed surfaces of the substrate are etched by the chemistry at a rate that varies as a function of plasma density, average electron energy, and other factors. The process is adjusted to achieve optimal conditions, including an appropriate concentration of desirable reactant and ion populations to more selectively act upon various desired features (e.g., trenches, vias, contacts, etc.) in the exposed regions of substrate. The exposed regions of the substrate where etching is required are typically formed of materials such as silicon dioxide ($SiO_2$), poly-silicon and silicon nitride, for example.

Dissociative attachment, in forming the ions during the exposed substrate etch process, prefers electron energy to be as low as possible. An example is where the chemistry is a $Cl2+e-$ process yielding $Cl+Cl-$, the negative ions being extracted for etching. Moreover, it is highly desirable to accomplish this reaction in a spatial afterglow region of a plasma, to avoid periodic plasma density deficiencies and the resultant increased risk of damage from unmitigated electromagnetic waves reaching the substrate, for example in microwave plasma sources.

While plasma etching has proven to be generally effective, process efficiency may be negatively impacted by a variety of factors. For example, undesirably high average electron energies ($T_e$) tend to impede ion formation, and thus results in reduced dissociative attachment at the substrate. Attempts to attenuate the negative effects noted above have included the introduction of Multi Pole Magnet (MPM) assemblies, for example as described in U.S. Pat. No. 5,595,627, entitled "Plasma Etching Method" and hereby expressly incorporated herein by reference. These configurations are not conducive to correcting magnetic irregularities by rotating the magnet assembly. Additionally, attempts to improve ion formation at the target substrate, have often necessitated more complex processing chemistries.

Therefore, an apparatus and method for uniformly applying low average electron energy plasma etch, to a substrate, is needed.

SUMMARY OF THE INVENTION

In accordance with principles of the present invention, a low average electron energy flux onto a substrate in a processing chamber is achieved by providing a cross-B magnetic field in the processing chamber between a plasma source and a substrate. The cross-B magnetic field directs high energy electrons moving through the plasma process space, leaving electrons arriving in the region near the substrate at an acceptably low ion energy.

In accordance with certain embodiments of the invention, the processing chamber is surrounded with a magnet array that forms a magnetic field through the chamber that is generally perpendicular to an axial path through the chamber from the plasma source, at one end of the chamber, to a substrate support at the other end of the chamber. In accordance with more particular embodiments of the invention, the field is rotated about the central axis of the chamber to enhance azimuthal uniformity of the flux onto the wafer.

In certain methods of the present invention, energy from a plasma source is imparted into a processing space to generate a plasma at one end of a processing chamber. Energetic electrons propagate toward a substrate that is supported at an opposite end of the processing chamber. A dipole magnetic field is imposed across a process space between the plasma source and the supported substrate, perpendicular to the direction of electron motion, with sufficient strength, height, and position to cause electrons having energies below an acceptable maximum level to divert from the substrate, but to allow electrons having energies at or below the acceptable maximum energy to be concentrated onto the substrate. The process may also include the step of reducing electron density non-uniformity by rotating the magnetic field coaxially about the processing chamber.

In certain embodiments, the dipole magnetic field is applied by utilizing an array of magnets spaced around the exterior of the processing chamber. In another embodiment, the array of magnets is comprised of a collection of magnetic columns. In yet another embodiment, the magnetic columns are comprised of a stacked plurality of discrete magnetic elements. In any of the above mentioned embodiments, the field may be applied utilizing permanent magnets.

According to principles of the present invention, a plasma processing apparatus is provided which includes a substrate support at a first end, and an energy source coupled to a second end of the processing chamber. The apparatus is further configured with a Dipole Ring Magnet (DRM) assembly, which envelops the exterior of the processing chamber. The DRM field is configured to pass perpendicular to, and act upon, the plasma region between the energy source and the substrate support, which results in filtering the higher energy electrons and allowing lower energy electrons to propagate from the plasma source to a quiescent region near the target substrate. In one embodiment he DRM assembly may configured to rotate coaxially around the processing chamber, serving to smooth out electron density irregularities.

These and other objectives and advantages of the present invention are set forth in the following detailed description of the drawings in which:

DETAILED DESCRIPTION OF EXEMPLARY EMBODIMENTS

A plasma processing method and apparatus are disclosed in various embodiments. However, one skilled in the relevant art will recognize that the various embodiments may be practiced without one or more of the specific details, or with alternative methods, materials, or components. Well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced with alternative specific details. Furthermore, the various embodiments shown in the figures are illustrative representations and are not necessarily drawn to scale.

References throughout this specification to "one embodiment" or "an embodiment" or "certain embodiments" or variations thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" or "in certain embodiments" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

Figure 1:
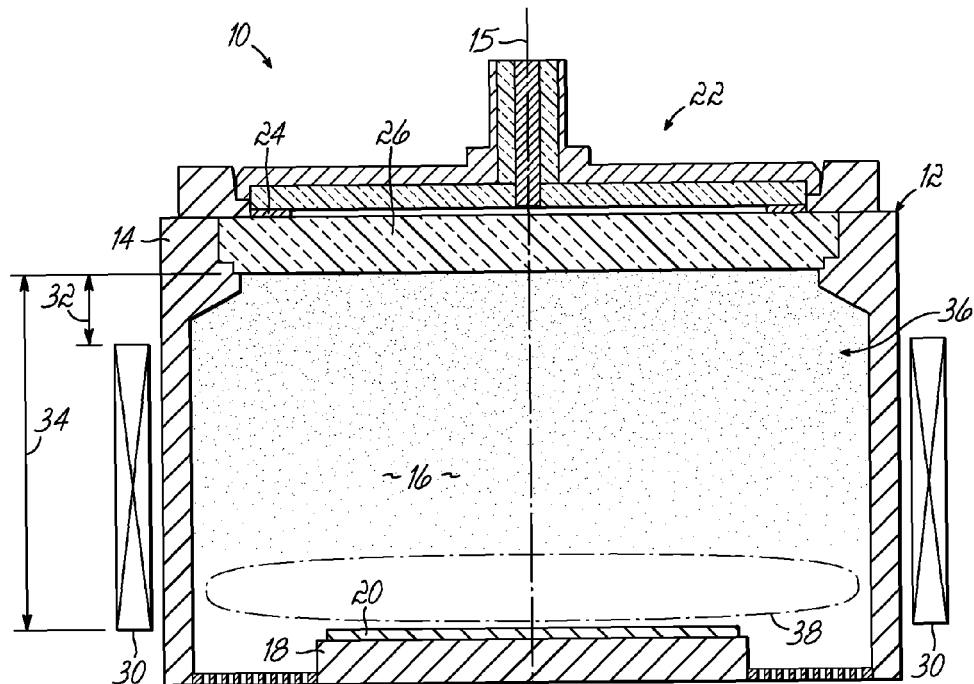
FIG. 1 is a cross sectional view of one embodiment of the disclosed processing system.

Referring now to the drawings, wherein like reference numerals designate identical or corresponding parts throughout the several embodiments or several views, FIG. 1 illustrates a plasma processing system 10 according to certain embodiments of the invention. The plasma processing system 10 may be, for example, a dry plasma etching system or a plasma enhanced deposition system.

One embodiment of the plasma processing system 10 includes a processing chamber 12 having a chamber wall 14 configured to enclose a process space 16. The chamber wall 14 is typically a cylinder having a central axis 15. The processing chamber 12 has therein a substrate support 18 configured to support a substrate 20 in the process space 16. Furthermore, the plasma processing chamber 12 has a plasma source 22 coupled to the processing chamber 12 and configured to energize a plasma in the process space 16. During operation of the system 10, the substrate 20 is exposed to plasma electrons, or process chemistry, or both, in process space 16. The plasma source 22 of the system 10 may be a surface-wave plasma (SWP) source that includes a radial line slot antenna 24. The plasma source 22 may be energized by direct current, radio frequency, microwave energy, or other energy sources known to the art. A quartz window 26 may be included to form a sealed interface between the plasma source 22 and the process pace 16. The plasma source 22 and the substrate support 18 are coaxially aligned on the chamber axis 15.

Figure 2:
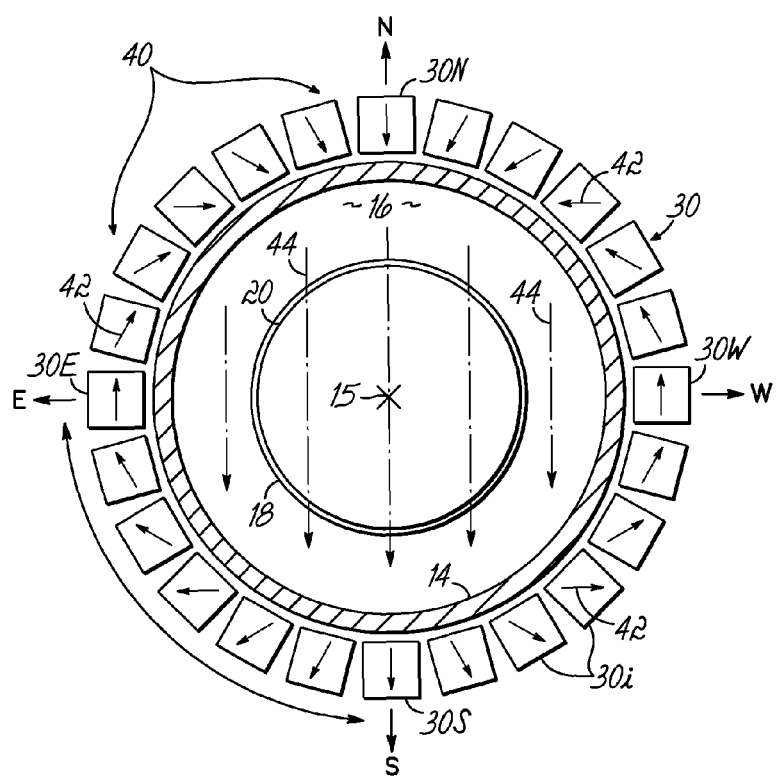
FIG. 2 is a top view of the processing chamber and DRM configuration.

As seen in FIG. 1, the plasma processing system 10 is provided with a plurality of individual magnetic columns 30, which, when combined together, form a dipole ring magnet (DRM) as illustrated further in FIG. 2. The magnetic columns 30 are situated coaxially outward from the chamber wall 14, and run substantially parallel with the chamber wall 14 and parallel to adjacent magnetic columns 30. To cooperate with the other magnetic columns 30 to form a DRM, each magnetic column 30 is rotated incrementally about its axis, which is parallel to the axis 15 of the chamber 12, such that the magnetic forces of each individual magnetic column 30 combine to result in an overall dipole magnetic field 44. In one embodiment, the field lines pass generally from the northernmost point of the dipole ring, to the southernmost portion of the dipole ring. The rotations of the magnets are related such that the lines of the B-field of the DRM through the processing space 16 in the chamber are parallel and perpendicular to the chamber axis 15.

In use, the magnetic columns 30 are positioned and dimensioned to allow the resulting magnetic field lines to act perpendicularly upon some portion of the process space 16. The columns originate at a first distance 32 below the quartz window 26, and extend to a second distance 34 below the quartz window 26. In one embodiment, the first distance originates where the plasma is no longer exothermic. The length of each magnetic column 30 should be dimensioned so that it is long enough to achieve electron cooling and low energy selection, and short enough to minimize plasma density loss. If the wafer is radio frequency (RF) biased, the magnetic columns 30 could be well above the substrate 20 to minimize DRM RF heating. Alternatively, terminal ends of the magnetic columns 30 could be placed in close proximity to the substrate 20 to take advantage of the DRM RF plasma. In one embodiment, the magnetic columns 30 originate at a first distance 32 of approximately 10 cm below the quartz and extend to a second distance 34 of approximately 45 cm below the quartz window 26. In one exemplary configuration, the substrate 20 could be placed coincident with the plane formed by the terminal ends of the magnetic columns 30 to eliminate DRM RF plasma effects.

In use, a plasma source 22 is energized to generate a plasma within the process space 16, which forms at the end of the chamber adjacent the window 26 and propagates toward the substrate support 18 into the plasma space 16. The Radial Line Slot Antenna 24, coupled to a microwave source, may be used to form a surface wave plasma. Details of the Radial Line Slot Antenna 24 in an SWP source are described in U.S. Pat. No. 8,114,245, hereby expressly incorporated herein by reference. In the plasma, if left unchecked, a majority of the produced electrons are excessively energetic, which results in unacceptably low negative ion concentrations in the region near the substrate 20. This can result in poor performance of the plasma etch upon the substrate. However, by introducing the magnetic columns 30, the resulting DRM field advantageously influences the distribution of electron energy levels near the substrate 20.

As high energy electrons travel from the top of the process space 16 to the substrate 20, the most energetic electrons are highly influenced by the DRM field and are deflected away from the substrate 20 with a force perpendicular to their direction of travel. Conversely, lower energy electrons are less significantly impacted by the DRM magnetic field forces, and are permitted to propagate further downward into the chamber toward the substrate 20. The presence of the DRM field results in an electron energy gradient 36, wherein less desirable high energy electron concentrations reside at the top of the process space 16, or are directed into the chamber wall 14 where they are sent to ground potential. Conversely, lower energy electrons propagate into a quiescent region 38 near the substrate 20, where their reduced energy facilitates negative ion production and effective etch performance.

FIG. 2 is a top view of the plasma processing system 10. The plurality of magnetic columns 30 cooperate to form a dipole ring magnet (DRM) 40, which surrounds the chamber wall 14. Each of the magnetic columns 30 are immovably mounted with a degree of incremental rotation so that the column field lines 42 cooperate to produce the desired collection of DRM field lines 44. For clarity of discussion, the resultant magnetic field of the DRM 40 can be described as having a north, east, south and west pole. The resulting DRM field lines 44 can be arbitrarily directed by orienting two opposite magnetic columns 30N and 30S so that their column field lines 42 are coincident with the center of the process space 16.

By way of example in FIG. 2, the northernmost magnet column 30N and southernmost column 30S, are positioned so that their respective column field lines 42 are oriented due south and pass through the center of the substrate support 18. To further cooperate with those two selected magnetic columns 30N, 30S, the easternmost magnetic columns 30E and westernmost column 30W are positioned so that their respective column field lines 42 are oriented due north. Magnetic columns 30i subtending the arc between the aforementioned four magnetic columns 30N, 30S, 30E, 30W, are progressively rotated by a fixed angular measurement. This angular positioning is determined by 180/(n+1), where n equals the number of magnetic columns 30 positioned between adjacent "compass" poles. For example, in FIG. 2, there are five magnetic columns positioned between the northernmost and easternmost magnetic columns 30. Therefore, each magnetic column 30 is rotated thirty degrees as they progress around the perimeter of the chamber wall 14, although these rotations may be modified to maintain parallel field lines in the chamber or to obtain some other field shape, if desired. Necessarily, diametrically opposed magnetic columns 30 have column field lines 42 oriented in the same direction. For example, in a proper configuration, the northeast and southwest magnetic columns 30 have column field lines 42 oriented in the same direction.

Overall, what results, are DRM field lines 44 which are oriented horizontally with respect to the target substrate, and pass perpendicular to the direction of electron travel. While other ring magnetic assemblies are known to the art of plasma etch processing, they are often implemented in a multi-pole configuration. For example, adjacent columns may have alternating poles facing the center of the substrate 20, configured to direct electron densities away from the chamber wall 14. However, a multi-pole magnet disadvantageously possesses a strong radial gradient and azimuthal field symmetry. The DRM 40 of the disclosed invention, however, aims to beneficially concentrate low energy electrons near the substrate 20 being processed while maintaining a high degree of uniformity. Because of the DRM 40 improved radial uniformity, the entire DRM 40 may be coaxially rotated with respect to the substrate 20 and chamber wall 14, to diminish any electron concentration irregularities that may exist.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of obtaining a low average electron energy flux onto a substrate in a processing chamber, comprising:
   supporting a substrate for processing at a first end of a processing chamber with a surface of the substrate facing a processing space in the processing chamber that contains a processing gas;
   coupling energy into the processing space to form a plasma containing ions of the processing gas at a second end of the chamber opposite the substrate;
   positioning a plurality of magnetic columns coaxially outward from a chamber wall and parallel to the chamber wall, wherein each magnetic column originates a first distance spaced from the second end of the processing chamber wherein the plasma in the processing chamber is no longer exothermic;
   allowing electrons to propagate in a direction from the second end of the processing chamber toward the substrate at the first end of the processing chamber;
   applying a dipole magnetic field, transversely across the chamber and perpendicular to the direction of propagation of the electrons, along a portion of the processing space, wherein the position of the dipole magnetic field is established based on the first distance and extending a length of the plurality of magnetic columns from the origination of the magnetic columns toward the first end of the processing chamber; and
   filtering the electrons with the dipole magnetic field to divert electrons that have an energy level above an acceptable maximum level from the substrate and allowing electrons that have an energy level at or below the acceptable maximum level to treat the substrate.

2. The method of claim 1, wherein the portion of the processing space along which the dipole magnetic field is applied extends sufficiently from the first distance origination of the processing space portion toward a second distance from the second end of the processing space and toward the substrate to allow for electron cooling and low energy selection and terminates a distance from the substrate so as to minimize plasma density loss.

3. The method of claim 1 further comprising rotating the dipole magnetic field.

4. The method of claim 1 wherein the energy is microwave energy.

5. The method of claim 4 wherein the coupling of the microwave energy into the processing space is from a Radial Line Slot Antenna at the second end of the processing chamber.

6. The method of claim 1, wherein:
   the portion of the processing space along which the dipole magnetic field is applied originates at the first distance spaced from the second end of the processing chamber wherein the plasma is no longer exothermic and extends sufficiently from the first distance origination of the processing space portion toward the substrate to allow for electron cooling and low energy selection and terminates a distance from the substrate so as to minimize plasma density loss;

the applying of the dipole magnetic field includes rotating the dipole magnetic field about an axis extending through the center of the processing chamber in the direction; and the coupling of energy into the processing space includes coupling microwave energy into the processing space from a Radial Line Slot Antenna at the second end of the processing chamber.

* * * * *